United States Patent [19]

Marcel et al.

[11] 3,895,378

[45] July 15, 1975

[54] DECODER FOR TELEPHONIC TRANSMISSIONS

[75] Inventors: Francois Marcel, Orsay; Jean-Louis Lagarde, Arpajon; Alain Manoury, Viry Chatillon, all of France

[73] Assignee: Compagnie Industrielle des Telecommunications Cit-Alcatel, France

[22] Filed: Dec. 18, 1973

[21] Appl. No.: 425,780

[30] Foreign Application Priority Data

Dec. 18, 1972 France .............................. 72.45037

[52] U.S. Cl. .......................................... 340/347 DA

[51] Int. Cl. .......................................... H03k 13/04

[58] Field of Search .............................. 340/347 DA

[56] References Cited

UNITED STATES PATENTS

| | | | |
|---|---|---|---|
| 3,366,949 | 1/1968 | Bruce | 340/347 DA |
| 3,543,264 | 11/1970 | Carbrey | 340/347 DA |
| 3,560,958 | 2/1971 | Braymer | 340/347 DA |
| 3,678,504 | 7/1972 | Kaneko | 340/347 DA |
| 3,810,158 | 5/1974 | Murakami | 340/347 DA |
| 3,815,123 | 6/1974 | Howard | 340/347 DA |

*Primary Examiner*—David L. Stewart
*Attorney, Agent, or Firm*—Craig & Antonelli

[57] ABSTRACT

Decoder having modular constitution for transmission by coded pulses constituted by several identical individual modules wired up and interconnected so as to perform, in interrelation, various elementary functions of the decoding. Each of the individual modules comprises four operational amplifiers, an output amplifier, a switching device selectively connecting the output of one operational amplifier to the input of the output amplifier, and a logic control circuit responsive to coded bits to actuate the switching device.

6 Claims, 1 Drawing Figure

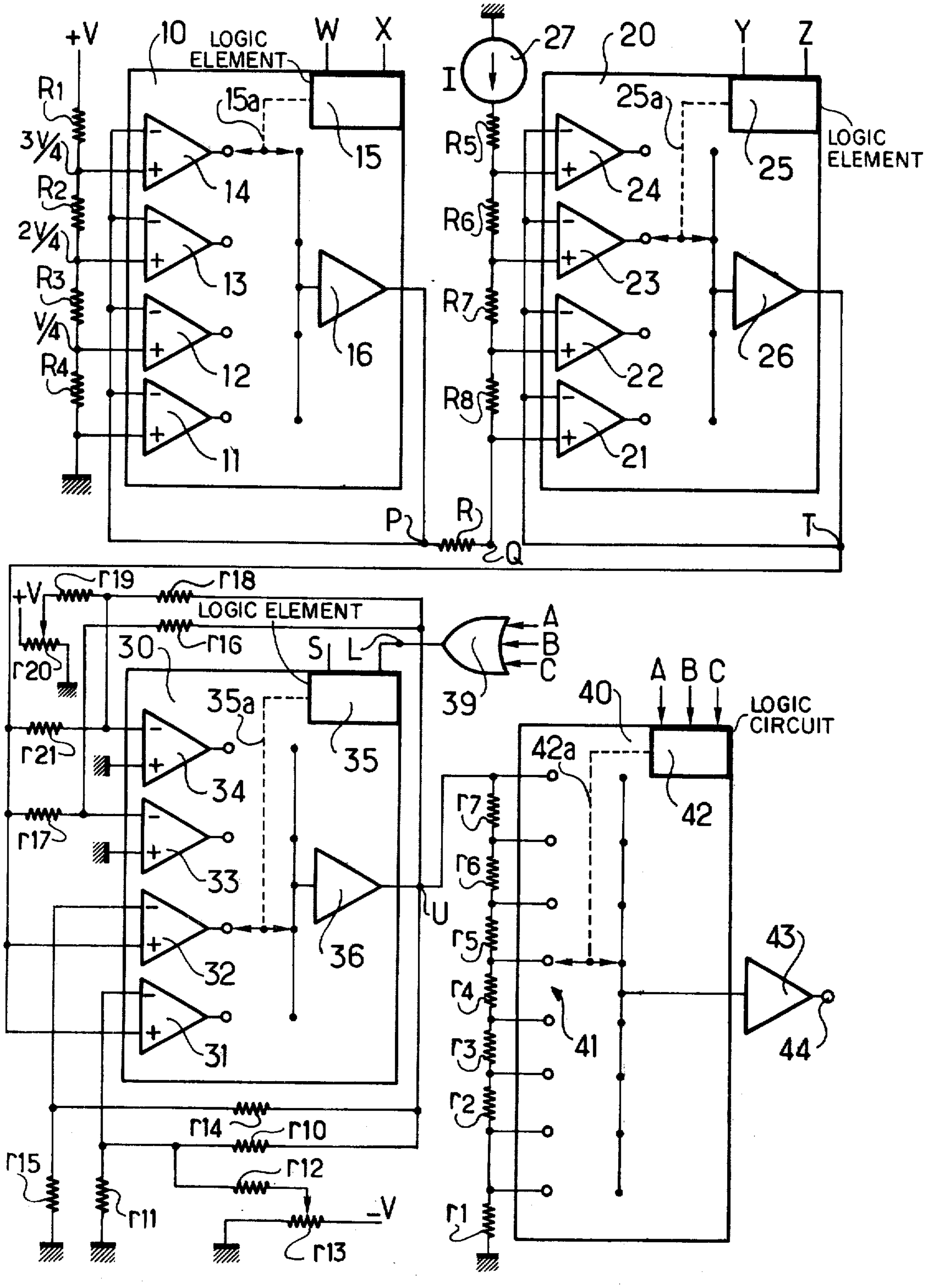
+V
10
LOGIC ELEMENT
W
X
R1
3V/4
R2
2V/4
R3
V/4
R4
15a
15
14
13
12
11
16
I
27
20
Y
Z
R5
R6
R7
R8
25a
25
LOGIC ELEMENT
24
23
22
21
26
P
R
Q
T
r19
r18
+V
LOGIC ELEMENT
r16
r20
30
S
L
35a
35
A
B
C
39
40
A B C
LOGIC CIRCUIT
42a
42
r21
34
r17
33
36
U
32
31
r7
r6
r5
r4
r3
r2
r1
41
43
44
r14
r10
r12
r15
r11
r13
-V

DECODER FOR TELEPHONIC TRANSMISSIONS

The invention comes within the field of telephonic transmissions of the PCM type in which, to improve the signal-to-noise ratio, a compression of the levels at the emission and a reverse expansion at the receiving are effected according to a predetermined law. It concerns a type of decoder constituted by several identical individual modules, wired up and interconnected so as to effect, in interrelation, diverse elementary functions of the decoding.

It is known that the coding of a level, in a "PCM" transmission having a standardized compression law, comprises 8 bits:

1. A sign bit (S);
2. Three bits defining the segment of the curve on which the coded level is situated (A, B, C);
3. Four bits (W, X, Y, Z) defining the position of the level on the segment defined by A, B, C.

Each segment comprises sixteen levels staged linearly on the segment; there are, in all, eight segments, the first two of which have the same slope and are aligned on the same direction; the segments having a higher order than 2 have, respectively, a slope which is half the preceding segment.

Decoders for PCM transmission having a compression law are known. They use networks of calibrated resistors in relation with one or several constant current or constant voltage sources, as well as switching elements having eight positions.

With respect to these known embodiments, the present invention provides a simple and more economical solution by the use of three identical modules wired up in a suitable way for the use of the positioning bits (W, X, Y, Z) and of the sign bit S, in relation with another element reconstituting the segment defined by the 3 bits A, B, C. The assembly operates with two constant voltage sources (+V and −V) and a constant current source (I).

The invention will be described in detail with reference to an example of embodiment illustrated in the accompanying drawing, which gives the diagram of a preferred embodiment of the invention.

The complete diagram comprises three modules having identical internal constitution, 10, 20, 30 and a fourth, different, subassembly 40.

The three identical modules 10, 20, 30 each comprise four operational amplifiers 11, 12, 13, 14, 21, etc., 31, etc., respectively and an output amplifier 16, 26, 36, respectively, as well as a switching device 15*a*, 25*a*, 35*a*, connecting up the output of one of the four amplifiers to the input of the output amplifier of the same module, positioned by a logic coding element 15, 25, 35, respectively.

Module 10 — In module 10 the four amplifiers 12, 12, 13, 14 as well as the output amplifier 16 are connected up as follower amplifiers having a gain of +1 with high input impedance and very low output impedance. The output of the amplifier 16, point P, is connected up to all the − inputs of the amplifiers 11 . . . 14.

A stabilized voltage, +V supplies a voltage divider having four resistors R1, R2, R3, R4, the last three of which, R2, R3, R4, have the same ohmic value. The tappings of the voltage divider are connected up to the + inputs of the four amplifiers 11 . . . 14, which therefore receive the voltages O, V/4, 2V/4, 3V/4, respectively.

The logic decoding element 15 receives two heavy weight positioning bits W, X.

Module 20 — the four amplifiers 21 . . . 24 and the output amplifier 26 are also follower amplifiers. The output T of the amplifier 26 is also connected up to the − inputs of the four amplifiers 21 . . . 24. A source of constant current 27 makes a calibrated current I pass in a chain of resistors R5, R6, R7, R8, in which the last three, R6, R7, R8, have the same ohmic value.

The switch 25*a* positioned by a decoding logic element 25 which receives the two light weight positioning bits Y, Z.

The low point Q of the chain of resistors R5 . . . R8 is connected up to the point P by a resistor R, whose function will be explained herebelow.

The circuit of the current generator 27 is closed up by a zero impedance installed at the output of the amplifier 16.

Module 30 — The output T of the amplifier 26 is connected up to the + input of the amplifier 31 and to the + input of the amplifier 32. The − input of the amplifier 31 is connected up to the output U of the amplifier 36 on the one hand, to the earth and to a continuous voltage −V, on the other hand by a network of resistors *r*10, *r*11, *r*12, *r*13, dimensioned so as to give the voltage of the point T an amplification of +2, to which is added a "pedestal" having for its amplitude the end of the first segment of the coding curve. The − input of the amplifier 32 is connected up to the said point U and to the earth by a network of resistors *r*14, *r*15, dimensioned so as to give an amplification of +2 to the voltage of the point T.

The + inputs of the amplifiers 33 and 34 are connected up to the earth. The − input of the amplifier 33 is connected up to the output U of the amplifier 36 on the one hand and to the point T on the other hand, by a network of resistors *r*16, *r*17, dimensioned to give an amplification of −2 to the voltage at the point T. The − input of the amplifier 34 is connected up to the output U of the amplifier 36, on the one hand at the point T and at a voltage of +V on the other hand, by a network of resistors *r*18, *r*19, *r*20, *r*21, dimensioned so as to give an amplification of −2 to the voltage of the point T, to which is added, having for its amplitude the end of the first segment of the coding curve.

The decoding logic element 35 positions the switch 35*a* as a function of the sign bit S and of a bit L equal to the sum A+B+C, formed by an OR circuit 39.

Lastly, the decoder comprises further a switch, having eight positions 40, of known type, whose inputs 41 are connected up to a voltage divider, formed by the resistors *r*1, *r*2 . . . *r*7. As is elsewhere known, the resistors *r*1 and *r*2 have the same ohmic value; the point common to *r*1 and *r*2 is connected up to the two lower points of the switch; the resistor *r*7 is connected up to the point U; the resistors *r*3 to *r*7 have ohmic values increasing in geometrical progression at a rate of 2. The switch 42*a* is positioned by a logic decoding circuit 42 which receives the three segment bits A, B, C. An output amplifier 43 which lowers the impedance, provides at 44 the decoded level.

The resistor R is dimensioned so as to supply a voltage stage equal to half a quantification step. Indeed, it is known that it is an advantage to take as a decoded value, not the lower terminal of a decoding step, but the middle value; thus, a continuous decoding curve is obtained without discontinuity by passing from the negative levels to the positive levels and vice-versa.

The following will therefore be found at a point O, according to the values of W and X, designation the value of a step by *p:*

| | | | |
|---|---|---|---|
| 0.5 p | 4.5 p | 8.5 p | 12.5 p |

To one of these four values, the module 20 adds one of four equal values respectively at 0*p*, 2*p*, 3*p*.

The value thus obtained at the point T is transferred to the point U, either with the sign + and a factor 2 or with the sign − and a factor 2 according to the valency of the sign bits S, either shifted by the amplitude of a segment, or not shifted, according to the value of the bit L. The data L has a significance "step 1 to 16" for the first segment ($A + B + C = 0$) and "step 17 to 32" for the second segment ($A + B + C = 0$).

With the three modules 10, 20 and 30, a purely linear decoder is constituted, without compression. Within the scope of the invention, with *n* modules, a linear decoder having $4^n$ stages could be constituted.

What is claimed is:

1. A decoder for a transmission of coded pulses defining $4^n$ linearly staged positions, comprising n interconnected modules of identical construction each including four operational amplifiers, an output amplifier, switching means for selectively connecting the output of one of said operational amplifiers to the input of said output amplifier and control means responsive to received coding bits for actuating said switching means according to the sum of the coding stages in decreasing ratios of units of four.

2. A decoder as defined in claim 1 wherein a first voltage divider is connected to a source of reference voltage, each operational amplifier of a first module having one input connected to a respective point on said first voltage divider and a second input connected to the output of said output amplifier of the first module.

3. A decoder as defined in claim 2 wherein a second voltage divider is connected between a constant current source and the output of the output amplifier of said first module, each operational amplifier of a second module having one input connected to a respective point on said voltage divider and a second input connected to the output of said output amplifier of the second module.

4. A decoder according to claim 3 wherein two operational amplifiers of said third module are connected to the output of said second module to give an amplification of +2 and of −2, respectively, and the two other operational amplifiers of said third module are connected to the output of said second module so as to give an amplification of +2 and of −2, respectively, and means for adding a fixed pedestal voltage to the output of said third module, according to whether the level to be coded is on the first segment of a compression law or on another segment.

5. A decoder according to claim 4, characterized in that said control means of the third module receives a sign bit and the logic sum of 3 bits defining the segment of a compression law having eight segments.

6. A decoder according to claim 5, comprising an output amplifier, a chain of resistors in binary progression and a switch having eight positions, capable of connecting one of the points of the said chain to the input of the said amplifier, characterized in that said chain of resistors is connected to the output of said third module and in that the switch is controlled by a control element which receives the three bits defining one of the segments of the said compression law.

* * * * *